United States Patent
Song (10) Patent No.: US 9,184,712 B2
(45) Date of Patent: Nov. 10, 2015

(54) LOW POWER HIGH-SPEED DIGITAL RECEIVER

(75) Inventor: Hongjiang Song, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 13/994,672

(22) PCT Filed: Dec. 21, 2011

(86) PCT No.: PCT/US2011/066483
§ 371 (c)(1),
(2), (4) Date: Jun. 14, 2013

(87) PCT Pub. No.: WO2013/109237
PCT Pub. Date: Jul. 25, 2013

(65) Prior Publication Data
US 2014/0232464 A1    Aug. 21, 2014

(51) Int. Cl.
*H03F 3/45* (2006.01)
*H04L 27/01* (2006.01)
*H04L 25/02* (2006.01)
*H04L 27/00* (2006.01)

(52) U.S. Cl.
CPC ........ *H03F 3/45645* (2013.01); *H03F 3/45179* (2013.01); *H04L 25/0276* (2013.01); *H04L 27/0002* (2013.01); *H04L 27/01* (2013.01); *H03F 2003/4504* (2013.01); *H03F 2200/129* (2013.01); *H03F 2203/45551* (2013.01); *H03F 2203/45588* (2013.01)

(58) Field of Classification Search
USPC ................................ 375/318, 297
See application file for complete search history.

(56) References Cited

U.S. PATENT DOCUMENTS

| | | | |
|---|---|---|---|
| 7,124,221 B1 * | 10/2006 | Zerbe et al. | 710/106 |
| 7,231,006 B2 | 6/2007 | Yamauchi | |
| 2001/0036237 A1 * | 11/2001 | Storm et al. | 375/350 |
| 2004/0203559 A1 | 10/2004 | Stojanovic et al. | |
| 2004/0234010 A1 | 11/2004 | Wei et al. | |
| 2005/0157780 A1 * | 7/2005 | Werner et al. | 375/232 |
| 2005/0271173 A1 | 12/2005 | Chou et al. | |
| 2006/0067440 A1 * | 3/2006 | Hsu et al. | 375/345 |

FOREIGN PATENT DOCUMENTS

| EP | 1580947 | 11/2008 |
|---|---|---|
| JP | 2004-023508 | 1/2004 |

OTHER PUBLICATIONS

Notification of Transmittal of the International Search Report and the Written Opinion of the International Searching issued for International Patent Application No. PCT/US2011/066483, mailed Aug. 14, 2013, 14 pages.
International Preliminary Report on Patentability for International Application No. PCT/US2011/066483, mailed Jul. 3, 2014, 10 pages.

* cited by examiner

*Primary Examiner* — Kabir A Timory
(74) *Attorney, Agent, or Firm* — Blakely, Sokoloff, Taylor & Zafman LLP (57) ABSTRACT

Described herein is a low power high-speed digital receiver. The apparatus of the receiver comprises: a sampling unit operable to sample a differential input signal and to boost input signal gain, the sampling unit to generate a sampled differential signal with boosted input signal gain; and a differential amplifier to amplify the sampled differential signal with boosted input signal gain, the differential amplifier to generate a differential amplified signal.

20 Claims, 9 Drawing Sheets

```
┌─────────────────────────────────────────────────────────┐
│ sampling a differential input signal to boost input     │
│ signal gain and to generate a sampled differential      │
│ signal with boosted input signal gain                   │
│ 501                                                     │
└─────────────────────────────────────────────────────────┘
                            │
                            ▼
┌─────────────────────────────────────────────────────────┐
│ amplifying the sampled differential signal with boosted │
│ input signal gain to generate a differential amplified  │
│ signal independent of offset cancellation to the        │
│ sampled differential signal                             │
│ 502                                                     │
└─────────────────────────────────────────────────────────┘
                            │
                            ▼
┌─────────────────────────────────────────────────────────┐
│ queuing the differential amplified signal to store the  │
│ differential amplified signal                           │
│ 503                                                     │
└─────────────────────────────────────────────────────────┘
                            │
                            ▼
┌─────────────────────────────────────────────────────────┐
│ applying decision feedback equalization (DFE) to        │
│ compensate for channel loss in the sampled              │
│ differential signal                                     │
│ 504                                                     │
└─────────────────────────────────────────────────────────┘
                            │
                            ▼
┌─────────────────────────────────────────────────────────┐
│ applying feed-forward equalization (FFE) to             │
│ compensate for channel loss in the sampled              │
│ differential signal                                     │
│ 505                                                     │
└─────────────────────────────────────────────────────────┘
```

LOW POWER HIGH-SPEED DIGITAL RECEIVER

CLAIM OF PRIORITY

This application claims the benefit of priority of International Patent Application No. PCT/US2011/066483 filed Dec. 21, 2011, titled "Low Power High-Speed Digital Receiver," which is incorporated by reference in its entirety.

FIELD OF THE INVENTION

Embodiments of the invention relate generally to the field of processors. More particularly, embodiments of the invention relate to a low power high-speed digital receiver.

BACKGROUND

Figure 1:
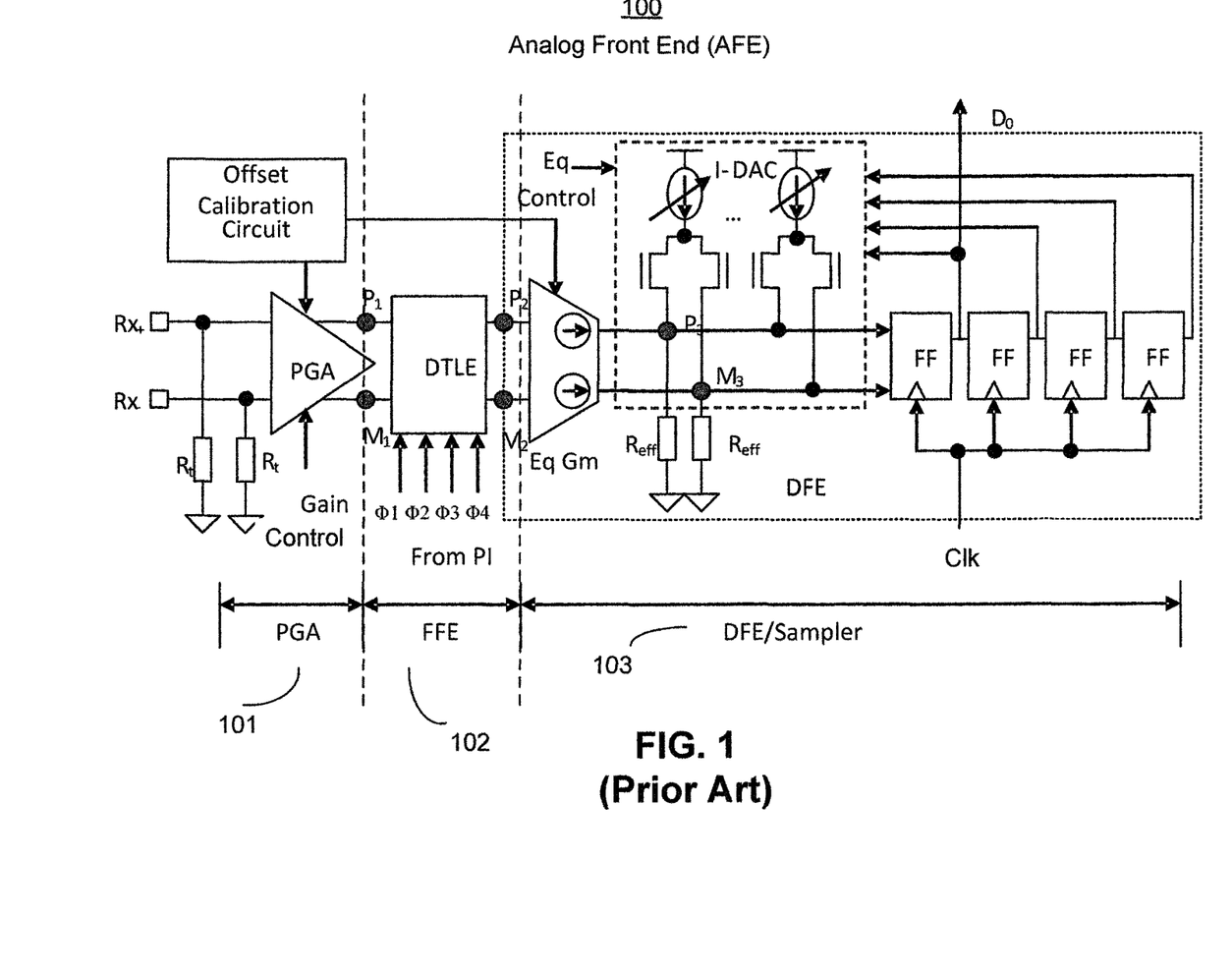
FIG. 1 is a typical analog front-end (AFE) of an input-output (I/O) receiver (Rx).

In a typical Very Large Scale Integrated (VLSI) high-speed input-output (I/O) receiver (Rx) circuit, incoming data stream is sampled at an analog front-end (AFE) unit controlled by a 4-phase sampling clock signal ($\phi 1$-$\phi 4$) provided from a phase interpolator (PI). FIG. 1 is a typical AFE 100 which consists of an amplifying stage 101, a passive discrete-time linear equalizer (DTLE) 102, and a decision feedback equalizer (DFE) 103.

The AFE 100, however, suffers from bandwidth degradation due to multi-stage circuit architecture—the multiple stages being 101, 102, and 103. The AFE 100 being a multi-stage architecture also exhibits high power dissipation due to the presence of several active circuit stages. The power dissipation further increases when bias current to the analog circuits in the AFE 100 is increased to achieve higher bandwidth for Rx channels. The incoming data stream (Rx+ and Rx−) at the AFE 100 is effectively sampled inside the DFE/Sampler stage 103 which is physically far away from the Rx input ports near 101. This physical distance increases the chances of noise injection to the sampled signals and degrades the performance of the link.

The term "performance" herein generally refers to power supply rejection ratio (PSRR), power consumption, process-temperature-voltage (PVT) variations, area, scalability to lower power supply voltages, I/O transfer rate, etc.

The AFE 100 has many analog circuits requiring high precision analog voltage and current circuits for their operation. These analog circuits make the AFE 100 highly sensitive to process-voltage-temperature (PVT) variations and transistor device mismatch effects. The AFE 100, and similar AFEs, are unable to meet the stringent low power specifications of Mobile Industry Processor Interface (MIPI®) as described in the MIPI® Alliance Specification for M-PHY$^{SM}$ Version 1.00.00 of Feb. 8, 2011 and approved on Apr. 28, 2011.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to a low power high-speed digital receiver (Rx). In one embodiment, the low power high-speed digital Rx comprises a front-end including a sampling unit operable to sample a differential input signal and to boost input signal gain, the sampling unit to generate a sampled differential signal with boosted input signal gain. The front-end further comprises a differential amplifier to amplify the sampled differential signal with boosted input signal gain, the differential amplifier to generate a differential amplified signal. In one embodiment, the front-end comprises a queue to store the differential amplified signal. In one embodiment, the front-end comprises a decision feedback equalizer (DFE) to receive the stored differential amplified signal. In one embodiment, the front-end further comprises a feed-forward equalizer (FFE), coupled to the DFE, to compensate for channel loss in the sampled differential signal with boosted input signal gain, wherein the FFE comprises programmable capacitors coupling the DFE to a node having the sampled differential signal, and wherein the DFE comprises an Exclusive-OR (XOR) logic unit.

In one embodiment, the sampling unit comprises: a first switch to sample a first signal, of the differential input signal, during a phase of a first clock signal, the sampled differential signal comprising a first signal; and a second switch to sample a second signal, of the differential input signal, during the phase of the first clock signal, the sampled differential signal comprising a second signal. In one embodiment, the sampling unit further comprises: a third switch to couple a first signal, of the differential amplified signal, to a node having the second signal of the differential input signal, the third switch to couple during a phase of a second clock signal. In one embodiment, the sampling unit further comprises: a fourth switch to couple a second signal, of the differential amplified signal, to a node having the first signal of the differential input signal, the fourth switch to couple during the phase of the second clock signal.

The technical effects of the embodiments discussed herein are many. For example, the low power high-speed digital Rx front-end discussed herein exhibits significantly lower power (50-70% lower) than the AFE 100 of FIG. 1. The low power high-speed digital Rx front-end discussed herein is implemented as a single active stage which results in much less sampling error than the sampling error of the multi-stage AFE 100 of FIG. 1. For example, the active stages in 101 and in DEF 103 are eliminated in the embodiments discussed herein. The embodiments discussed herein include no analog circuit that require a voltage or current reference generator for providing a reference current or voltage. By eliminating the analog circuitry, which is present in AFE 100 of FIG. 1, higher design scalability is achieved by the embodiments discussed herein because the entire active circuit is implemented using digital circuits that have very low PVT sensitivity. The embodiments of the low power high-speed digital Rx front-end discussed herein have a built-in auto-zero function in the switched-capacitor differential amplifier/sampler. This auto-zero function reduces the device mismatch effect (offset) thus making the design discussed herein highly scalable across different process technologies.

The embodiments discussed herein exhibit higher performance with improved Rx front-end bandwidth since the bandwidth-limiting circuit blocks in the AFE 100 are eliminated in the Rx front-end. The embodiments discussed herein also exhibit higher performance because of lesser jitter injection than the jitter injection in the AFE 100. One reason for the reduced jitter injection is that the data signal is sampled physically closer to the point where the signals are received by the Rx. The embodiments discussed herein simplifies the design of the amplifier 100, the FFE 102, and the DFE 103 resulting in lower silicon area and thus lower design and manufacturing cost. The technical effects discussed herein are not limited to the above effects. Other technical effects are contemplated by the embodiments discussed herein.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The term "wide frequency ranges" or "high speed" herein refers to at least high speed (HS) GEAR ranges from HS-GEAR 1 to HS-GEAR 3 as described in the MIPI® Alliance Specification for M-PHY$^{SM}$ Version 1.00.00 of Feb. 8, 2011 and approved on Apr. 28, 2011.

Figure 2A:
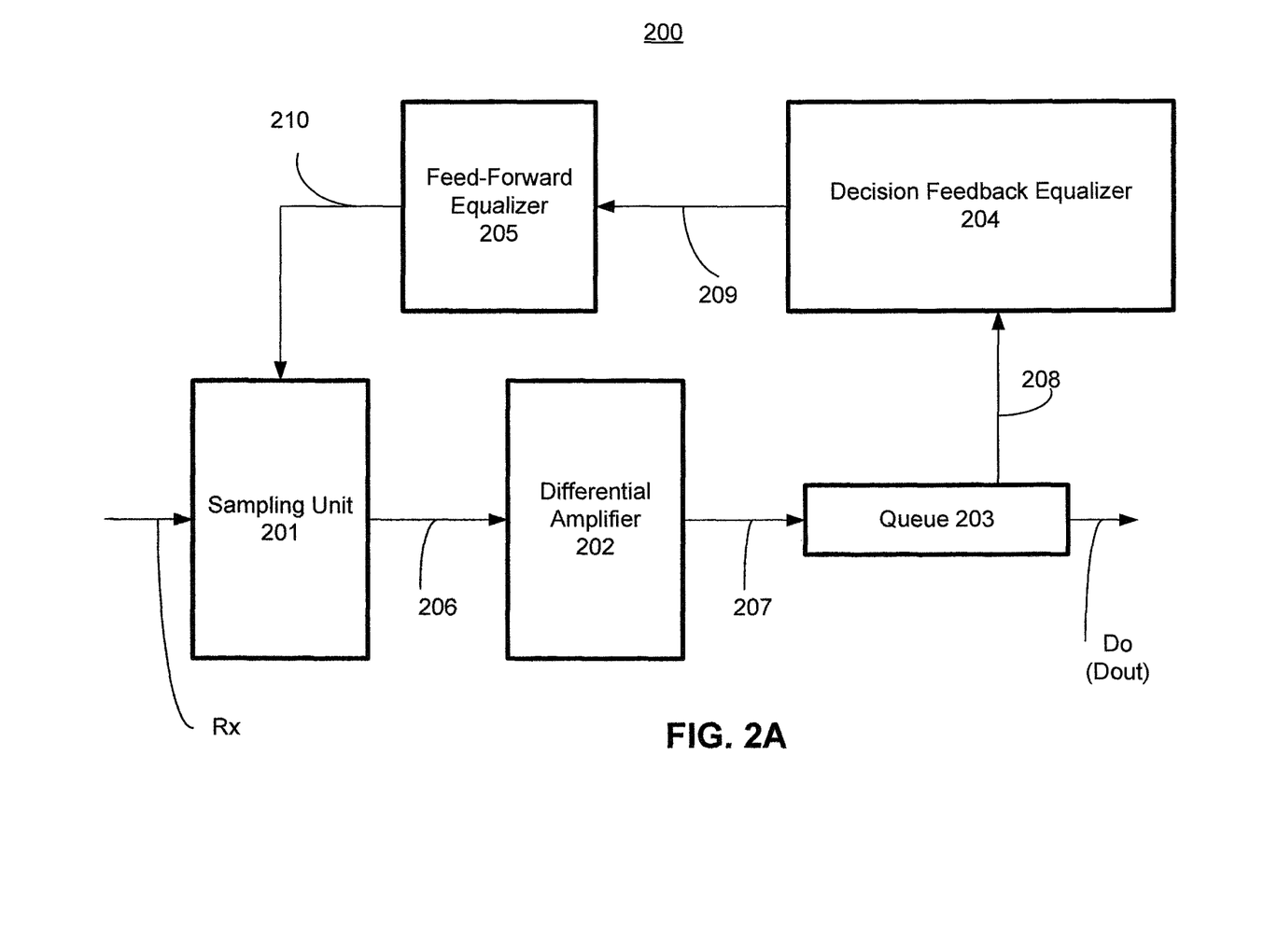
FIG. 2A is a high level architecture of a low power high-speed digital Rx front-end, according to one embodiment of the invention.

FIG. 2A is a high level architecture of a low power high-speed digital Rx front-end 200, according to one embodiment of the invention. In one embodiment, the Rx front-end 200 comprises a sampling unit 201 operable to sample a differential input signal Rx and to boost input signal gain, wherein the sampling unit 201 is operable to generate a sampled differential signal 206 with boosted input signal gain. In one embodiment, the Rx front-end 200 comprises a differential amplifier 202 to amplify the sampled differential signal 206 with boosted input signal gain, the differential amplifier 202 to generate a differential amplified signal 207. In one embodiment, the Rx front-end 200 comprises a queue 203 to store the differential amplified signal 208. In one embodiment, the Rx front-end 200 comprises a DFE unit 204 which is operable to receive the stored differential amplified signal 208 and output a signal 209. In one embodiment, the Rx front-end 200 further comprises a FFE unit 205, coupled to the DFE 204, to receive the signal 209 and compensate for channel loss, via signal 210, in the sampled differential signal 206 with boosted input signal gain. In one embodiment, the FFE unit 205 comprises programmable capacitors coupling the DFE unit 204 to a node having the sampled differential signal Rx, and wherein the DFE unit 204 comprises an Exclusive-OR (XOR) logic unit. The output of the Rx front-end is a sampled signal, Do (Dout).

Figure 2B:
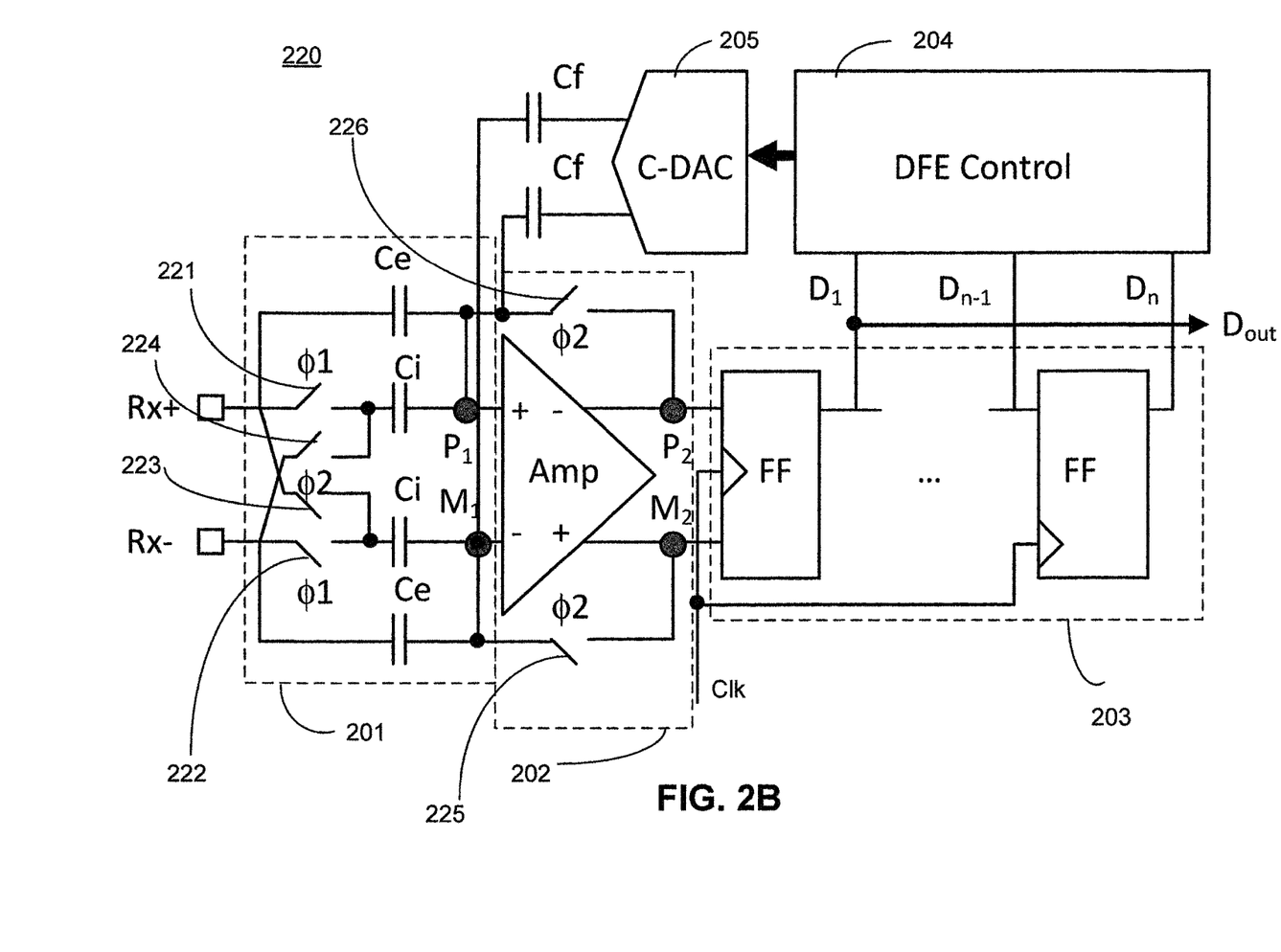
FIG. 2B is a circuit level implementation of the low power high-speed digital Rx front-end, according to one embodiment of the invention.

FIG. 2B is a circuit level implementation 220 of the low power high-speed digital Rx front-end 200, according to one embodiment of the invention. FIG. 2B is described with reference to FIG. 2A. In one embodiment, the sampling unit 201 comprises: a first switch 221 to sample a first signal Rx+, of the differential input signal Rx, during a phase φ1 of a first clock signal Clk1 (shown as CLK for FIG. 2B, and Clk1 in FIG. 2D). The sampled differential signal comprises a first signal $P_1$. In one embodiment, the sampling unit 201 comprises a second switch 222 to sample a second signal Rx−, of the differential input signal Rx, during the phase φ1 of the first clock signal Clk1, the sampled differential signal comprising a second signal $M_1$.

The term '$P_1$' is interchangeably used to refer to node $P_1$ or the first sampled signal $P_1$ which implies that the node $P_1$ is carrying the first sampled signal after being sampled by the first switch 221. The term '$M_1$' is interchangeably used to refer to node $M_1$ or the second sampled signal $M_1$ which implies that the node $M_1$ is carrying the second sampled signal after being sampled by the second switch 222.

Figure 2C:
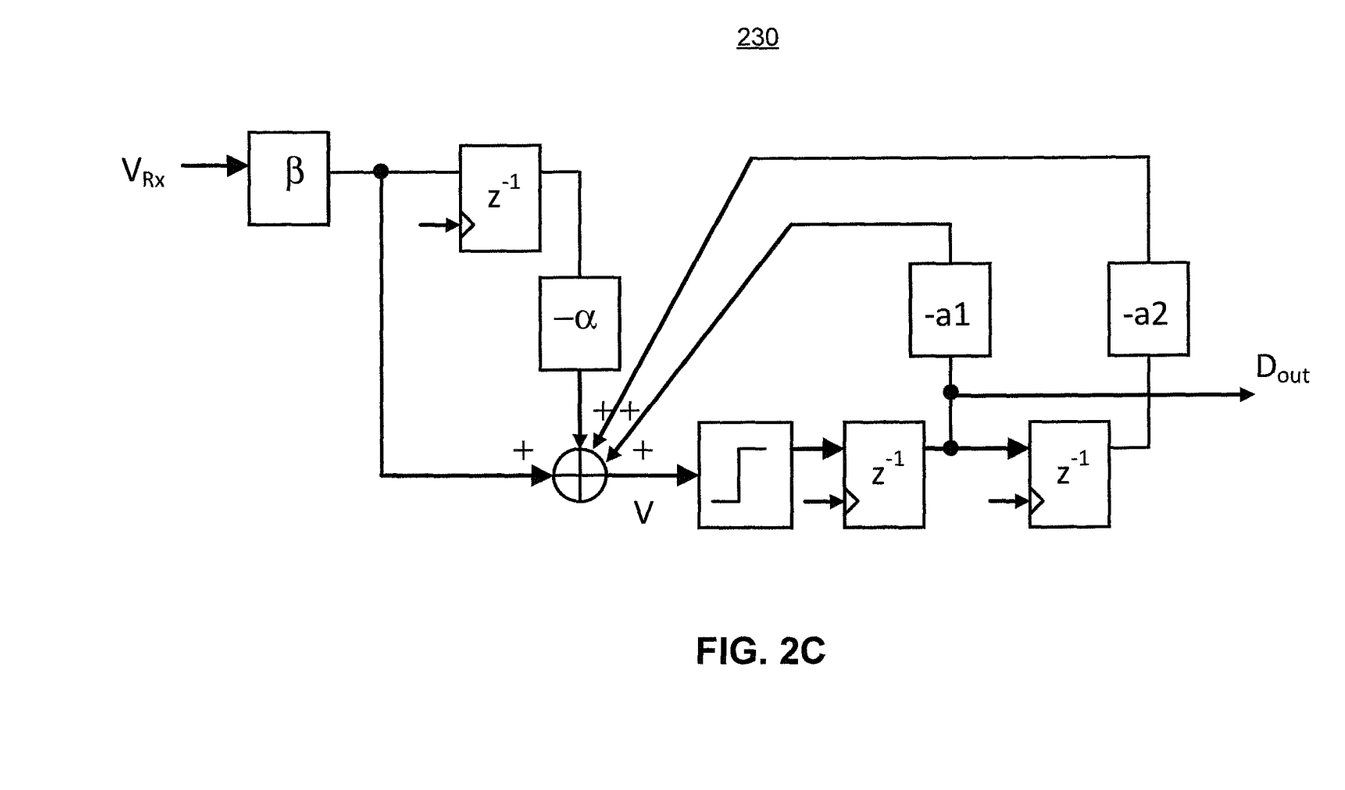
FIG. 2C is a Z-Domain equivalent of the low power high-speed digital Rx front-end, according to one embodiment of the invention.
Figure 2D:
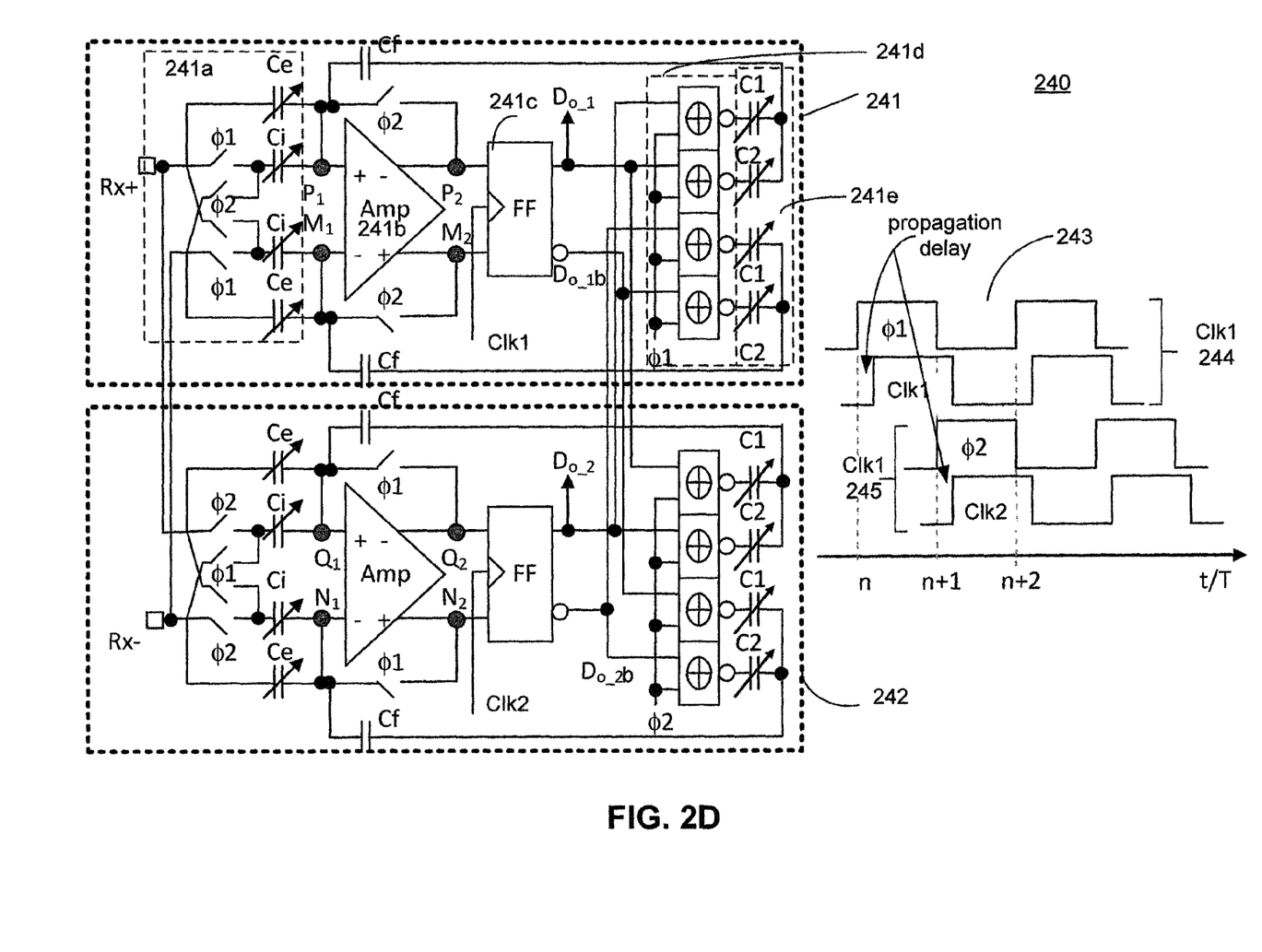
FIG. 2D is a half-rate circuit level implementation of the low power high-speed digital Rx front-end, according to one embodiment of the invention.

In one embodiment, the sampling unit 201 further comprises a third switch 223 to couple a first signal $P_2$, of the differential amplified signal, to a node having the second signal Rx− of the differential input signal, the third switch 223 to couple during a phase φ2 of a second clock signal Clk2 (shown as CLK for FIG. 2B, and Clk2 in FIG. 2D). In one embodiment, the sampling unit 201 further comprises a fourth switch 224 to couple a second signal $M_2$, of the differential amplified signal, to a node having the first signal Rx+ of the differential input signal, the fourth switch 224 to couple during the phase φ2 of the second clock signal Clk2.

The term '$P_2$' is interchangeably used to refer to node $P_2$ or the first amplified signal $P_2$ which implies the node $P_2$ carrying the first amplified signal after being amplified by the amplifier 202. The term '$M_2$' is interchangeably used to refer to node $M_2$ or the second amplified signal $M_2$ which implies that the node $M_2$ is carrying the second amplified signal after being amplified by the amplifier 202.

In one embodiment, the first switch 221 couples the first signal Rx+ to node $P_1$ via capacitor Ci. In one embodiment, the second switch 222 couples the second signal Rx− to node $M_1$ via another capacitor Ci.

In one embodiment, the fourth switch 224 couples the first sampled signal (sampled by the first switch 221) to node $M_1$ via capacitor Ce. In one embodiment, the third switch 223 couples the second sampled signal (sampled by the second switch 222) to node $P_1$ via capacitor another Ce. In one embodiment, the output node $M_2$ of the amplifier 202 is coupled to nodes $M_1$ and $P_1$ via a fifth switch 225, wherein the fifth switch 225 is controlled by the phase φ2 of the second clock signal Clk2. In one embodiment, the output node $P_2$ of the amplifier 202 is coupled to nodes $M_1$ and $P_1$ via a sixth switch 226, wherein the sixth switch 226 is controlled by the phase φ2 of the second clock signal Clk2. The sampling unit 201 herein provides at least a 2× input gain to the input signals Rx+ and Rx−, resulting in a boasted sampled signal at nodes $P_1$ and $M_1$.

For purposes of this application, the transistors described herein are metal oxide semiconductor (MOS) transistors, which include drain, source, and gate terminals. However, those skilled in the art will appreciate that other transistors may be used without departing from the scope of the invention.

The switches discussed herein are implemented as transistors (e.g., MOS transistors) controlled by the phases of clock signals. For example, the first switch 221 is controlled by the phase φ1 of the second clock signal Clk1. The term "controlled by" herein refers to turning on the switch during the phase φ1 of the second clock signal Clk1. In one embodiment, the signal carrying the phase φ1 of the second clock signal Clk1 is coupled to a gate terminal of the transistor being controlled by the phase φ1 of the second clock signal Clk1. In such an embodiment, the switch in turned on during a logical high level of the phase φ1.

In one embodiment, the output of the amplifier 202 couples to a queue 203. In one embodiment, the amplifier 202 is a differential amplifier 341 as described herein with reference to FIG. 3. In one embodiment, the differential amplifier 341 is a self-biased symmetrical load output buffer circuit. In one embodiment, the differential amplifier 341 receives as inputs the sampled first and second signals $P_1$ and $M_1$ from the sampling unit 201 and generates differential signals $P_2$ and $M_2$ respectively. In one embodiment, the differential amplifier 341 is operable to reject common mode in the sampled first and second signals (differential signals). In one embodiment, the differential amplifier 341 has a built-in auto-zero function. In one embodiment, the differential amplifier 341 is operable to amplify the sampled first and second signals $P_1$ and $M_1$ from the sampling unit 201 independent of offset cancellation in the sampled differential signal.

Figure 3:
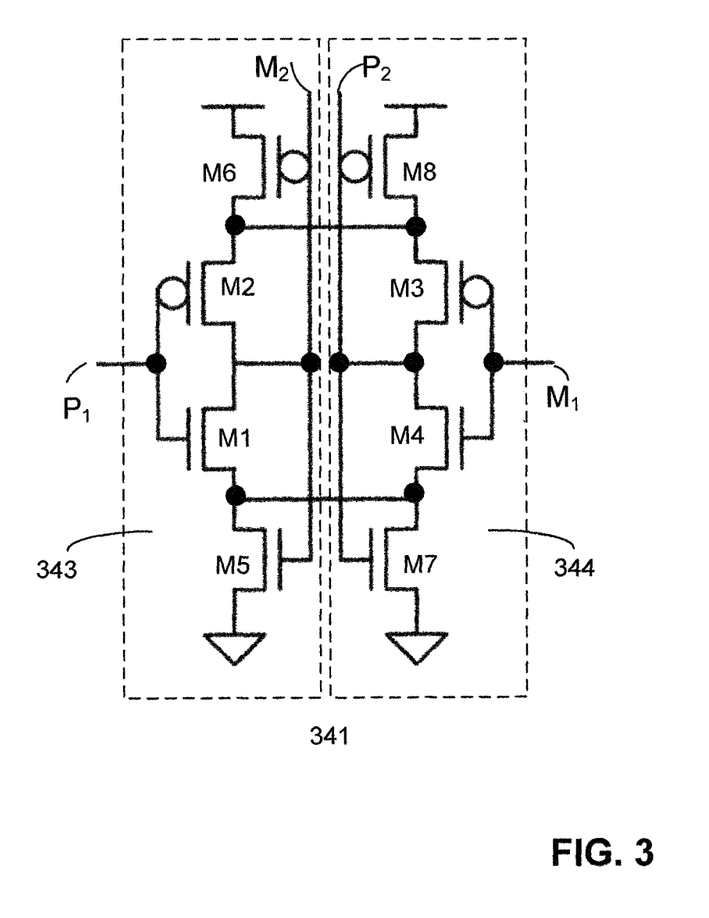
FIG. 3 is a circuit level implementation of an amplifier in the low power high-speed digital Rx front-end, according to one embodiment of the invention.

In one embodiment, the differential amplifier 341 comprises two complementary MOS (CMOS) transistor pairs (M1, M2, and M3, M4) that are used as the input devices, which extend the input signal to full swing. In one embodiment, additional CMOS transistor pairs (M5, M6, and M7, M8) are used for either current biases or loads. The gate terminals of the bias/load transistors may be coupled together as illustrated. In these embodiments, circuits 343 and 344 are symmetric at both left-to-right and top-to-bottom directions. Three feedback loops are provided in the circuit structure, including a left loop by transistors M1, M2, M5, and M6, a right loop by transistors M3, M4, M7, and M8, and a common mode loop by transistors M5, M6, M7, and M8.

In one embodiment, the transistors M1, M4, M5, and M7 are n-type MOS (NMOS) transistors while transistors M2, M3, M6, and M8 are p-type MOS (PMOS) transistors as shown in FIG. 3.

The embodiment of the differential amplifier 341 provides higher bias current around the cross-point to achieve approximately zero DC (direct current) bias, high speed switching, and a "soft landing" (e.g., substantially avoiding noise and glitches in the signal). These properties help make the differential amplifier 341 more robust for various applications (e.g., large power supply range, rail-to-rail signal swings, large transistor size range, etc.,) and scalable for different manufacturing process technologies.

Referring back to FIG. 2B, the output ($P_2$ and $M_2$) of the amplifier 202 couples to the queue 203. In one embodiment, the queue 203 comprises a chain of sequential units. In one embodiment, the sequential units are flip-flops (FFs) that are operable to receive the clock signal Clk. In other embodiments, other forms of sequential logic units may be used without changing the scope of the embodiments of the invention. As discussed with reference to FIG. 2D, which shows a half-rate circuit level implementation of the circuit 200, one half of the half-rate circuit which mimics the circuit of 200 receives Clk1 while the other half of the half-rate circuit which mimics the circuit of 200 receives Clk2 as clock signal for their respective queues.

Referring back to FIG. 2B, the output of each FF in the queue 203 is input to the next FF in the chain. In one embodiment, the output of each FF is received by the DFE unit 204. In one embodiment, the output of each FF forms part of a bus carrying the output signal Do (Dout). In one embodiment, the DFE unit 204 comprises XOR logic units, wherein each XOR logic unit receives an output (e.g., $D_1$) of a FF (e.g., the left most FF) from the queue 203, also receives φ1 or φ2 of Clk signal. As discussed with reference to FIG. 2D, the DFE unit 204 of the top half-rate circuit receives φ1 of Clk1, while the bottom half-rate circuit receives φ2 of Clk2.

Referring back to FIG. 2B, the output of the DFE unit 204 is received by a FFE unit 205. In one embodiment, the FFE unit 205 comprises variable capacitors which convert digital signals to analog signals. In one embodiment, the variable capacitors are operable to adjust their capacitances in response to a signal. In one embodiment, the analog signals couple to nodes $P_1$ and $M_1$ via capacitors Cf as shown in FIG. 2B. In one embodiment, the capacitors Ci, Ce, and Cf provide offset cancellation to the amplifier 202. In one embodiment, by changing the capacitance values of the capacitors Ci, Ce, and Cf, the gain of the circuit 220 is modified.

In one embodiment, the sum of the capacitance values of Ci and Ce is substantially close to 100 fF. The term "substantially" herein refers to being within 20% of the desired value. In one embodiment, the sum of the capacitance values of Ci and Ce can be programmed or partitioned between capacitors Ci and Ce linearly. For example, when Ci is substantially close to zero then Ce is substantially close to 100 fF, and when Ci is substantially close to 100 fF then Ce is substantially close to Ci. In this embodiment, the capacitance value of Cf is substantially close to one-tenth of the sum of capacitance values of Ci and Ce, i.e. (1/10)(Ci+Ce). For example, when sum of the capacitance values of Ci and Ce is substantially close to 100 fF, then the capacitance value of Cf is substantially close to 10 fF.

FIG. 2D is a half-rate circuit level implementation 240 of the low power high-speed digital Rx front-end 200, according to one embodiment of the invention. The half-rate circuit 240 comprises of a top half 241 and a bottom half 242, each half receiving the first and second differential signals Rx+ and Rx−. The waveforms 243 show two sets of waveforms. The first set of waveforms 244 are Clk1 signals having a first phase φ1. The waveform labeled Clk1 is a delayed version of the waveform above it, the delay representing propagation delay through logic gates (not shown). The second set of waveforms 245 are Clk2 signals having a second phase φ2. The waveform labeled Clk2 is a delayed version of the waveform above it, the delay representing propagation delay through logic gates (not shown).

So as not to obscure the embodiments of the invention, only the top half 241 of the half-rate circuit 240 is discussed herein with reference to FIGS. 2A-B. The sampling unit 241a is the same as the sampling unit 201 and the amplifier 241b is the same as the amplifier 202. The queue 241c is the same as the queue 203. For ease in explaining the queue 203, only a single FF 241c is shown. However, a chain of FFs are also contemplated herein. In the embodiments discussed herein, the FF 241c generates differential signals (Do_1 and Do_1b) which are received by the DFE units of both half rate circuits 241 and 242. In one embodiment, the DFE unit 241d has XOR logic units that receive the output from the queues of both top and bottom half rate circuits (241, 242) along with either first phase φ1 of Clk1 or the second phase φ2 of Clk2 as illustrated in FIG. 2D. In one embodiment, the FFE unit 241e comprises variable capacitors C1 and C2, the outputs of which are coupled to the inputs of the amplifier 241b. In one embodiment, DFE equalization by the DFE unit 241 is performed by capacitors Ci, Ce, Cf, C1, and C2.

The operation of the half circuit 240 can be analyzed employing the charge re-distribution principle, where the input offset of the amplifier/sampler is purposely included for demonstrating the auto-zero operation. During the φ2 phase (auto-zero phase), the input ($P_1$, $M_1$) of the sampling amplifier 202 is pre-charged to an output common-mode $V_{cm}$. The total charges stored on nodes $P_1$ and $M_1$ can be expressed as (1):

$$\begin{cases} Q_{P1}(n) = C_i[V_{cm} + V_{offset} - V_{RX-}(n)] + C_e[V_{cm} + V_{offset} - V_{RX+}(n)] + \\ \qquad C_f[V_{cm} + V_{offset} - V_{eff+}(n)] \\ Q_{M1}(n) = C_i[V_{cm} - V_{RX+}(n)] + C_e[V_{cm} - V_{RX-}(n)] + C_f[V_{cm} - V_{eff-}(n)] \end{cases}$$

where $V_{eff+}$ and $V_{eff-}$ are the equivalent feedback equalization voltage from the positive and negative paths.

During φ1 phase (sampling phase), the charges stored at the two input nodes of the sampling amplifier 202 are given respectively as (2):

$$\begin{cases} Q_{P1}(n+1) = C_i[V_{P1}(n+1) + V_{offset} - V_{RX+}(n+1)] + \\ \qquad C_e[V_{P1}(n+1) + V_{offset} - V_{RX+}(n+1)] + \\ \qquad C_f[V_{P1}(n+1) + V_{offset} + V_{eff+}(n)] \\ Q_{M1}(n+1) = C_i[V_{M1}(n+1) - V_{RX-}(n+1)] + \\ \qquad C_e[V_{M1}(n+1) - V_{RX-}(n+1)] + C_f[V_{M1}(n+1) + V_{eff-}(n)] \end{cases}$$

Based on the charge conservation principle:

$$\begin{cases} Q_{P1}(n) = Q_{P1}(n+1) \\ Q_{M1}(n) = Q_{M1}(n+1) \end{cases} \qquad (3)$$

Based on equations (1), (2), and (3), equation (4) is derived as:

$$\begin{cases} (V_{P1}(n+1) - V_{cm})[C_i + C_e + C_f] = [C_i + C_e]V_{RX+}(n+1) - \\ \qquad C_e V_{RX+}(n) - C_i V_{RX-}(n) - 2C_f V_{eff+}(n) \\ (V_{M1}(n+1) - V_{CM})[C_i + C_e + C_f] = [C_i + C_e]V_{RX-}(n+1) - \\ \qquad C_e V_{RX-}(n) - C_i V_{RX+}(n) - 2C_f V_{eff-}(n) \end{cases}$$

Solving for differential voltage at the sampling amplifier 202 input nodes at the sampling phase results in equation (5) as:

$$V(n+1)[C_i + C_e + C_f] = [C_i + C_e]V_{RX}(n+1) - \qquad (6)$$
$$(C_e - C_i)V_{RX}(n) - 2C_f V_{eff}(n)$$

where $$\begin{cases} V(n) \equiv V_{P1}(n) - V_{M1}(n) \\ V_{RX}(n) \equiv V_{RX+}(n) - V_{RX-}(n) \\ V_{eff}(n) \equiv V_{eff+}(n) - V_{eff-}(n) = \dfrac{V_{CC}}{C_1 + C_2}\begin{bmatrix} C_1 sgn(V(n)) + \\ C_2 sgn(V(n-1)) \end{bmatrix} \end{cases}$$

The time domain transfer function of the input to the output of the Rx front-end 200 is given as equation (7):

$$V(n+1) = \dfrac{[C_i + C_e]V_{RX}(n+1) - (C_e - C_i)V_{RX}(n) - 2V_{CC}\dfrac{C_f}{C_1+C_2}[C_1 sgn(V(n)) + C_2 sgn(V(n-1))]}{[C_i + C_e + C_f]}$$

Based on the mathematical derivation discussed herein, the Rx front-end 200 realizes built-in functions of auto-zero, 2-tap FFE equalization, 3-tap DEF equalization, and amplification operations.

FIG. 2C is a Z-Domain equivalent 230 of the low power high-speed digital Rx front-end 200, according to one embodiment of the invention. The Z-Domain equivalent equation is given as:

$$\dfrac{V(z)}{V_{RX}(z)} = \beta \dfrac{1 - \alpha z^{-1}}{1 + a_1 z^{-1} + a_2 z^{-2}} \qquad (8)$$

where, Vcc is the high power supply, and where:

$$\begin{cases} \beta \equiv \dfrac{(C_e + C_i)}{(C_i + C_e + C_f)} \\ \alpha \equiv \dfrac{(C_e - C_i)}{(C_i + C_e)} \\ a_1 \equiv \dfrac{2C_f}{[C_i + C_e]}\left(\dfrac{C}{C_1 + C_2}\right)V_{CC} \\ a_2 \equiv \dfrac{2C_f}{[C_i + C_e]}\left(\dfrac{C_2}{C_1 + C_2}\right)V_{CC} \end{cases} \qquad (9)$$

Figure 4:
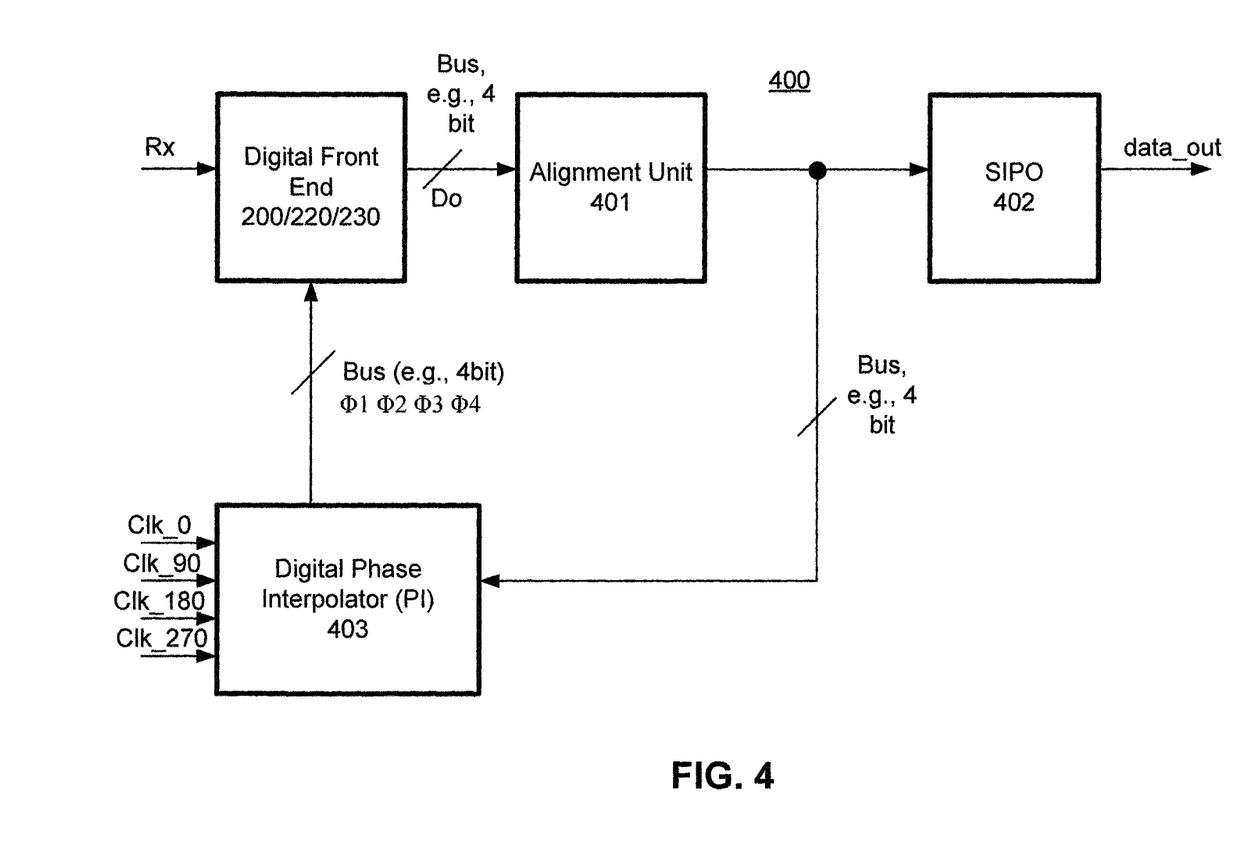
FIG. 4 is a high level block diagram of a receiver unit comprising the low power high-speed digital Rx front-end, according to one embodiment of the invention.

FIG. 4 is a high level block diagram of a Rx 400 comprising the low power high-speed digital Rx front-end, according to one embodiment of the invention. In one embodiment, the Rx 400 comprises the low voltage digital Rx front-end (200/220/230) according to the embodiments discussed here.

The low voltage digital Rx front-end (200/220/230) is operable to sample the input Rx signal using the interpolated phase signals φ1, φ2, φ3, and φ4 from a phase interpolator (PI) 403, where φ1 (first phase) has a transition edge in a middle of a phase of the Rx signal, where φ2 (second phase) has a transition edge at a crossing of a phase of the Rx signal and a successive phase of the data signal, where φ3 (third phase) has a transition edge in a middle of the successive phase of the input Rx signal, and where φ4 (fourth phase) has a transition edge at the end of the phase of the successive phase of the Rx signal.

In one embodiment, the Rx 400 comprises an alignment unit 401 which receives the sampled Rx signals, sampled by φ1, φ2, φ3, and φ4 phases and generates output signals which are synchronized to the transmit clock signal domain. The alignment unit 401 is also called the synchronization unit. The output of the alignment unit 401 is then input to the PI 403, where a digital control unit determines from the aligned signals (output of the alignment unit 202) whether the phases φ1, φ2, φ3, and φ4 are properly positioned in time, i.e., whether they are phase shifted to sample the Rx signal at the four points discussed above.

In one embodiment, the Rx 400 comprises a serial-in-serial-out (SIPO) 402 unit that generates the data_out signal which is then processed by other logic units (not shown) of a processor comprising the I/O receiver 200. The I/O receiver can be used as a Mobile Industry Processor Interface (MIPI®) M-PHY$^{(SM)}$ receiver; a Peripheral Component Interconnect Express (PCIe) receiver; a Serial Advanced Technology Attachment (SATA) receiver; a Serial Attached SCSI (SAS) receiver; a Double Data Rate x (DDRx) receiver, were 'x' is an integer, for example, x=4 and above; a High-Definition Multimedia Interface (HDMI) receiver; or a Universal Serial Bus x (USBx) receiver, where 'x' is an integer, for example x=2 and above.

Figure 5:
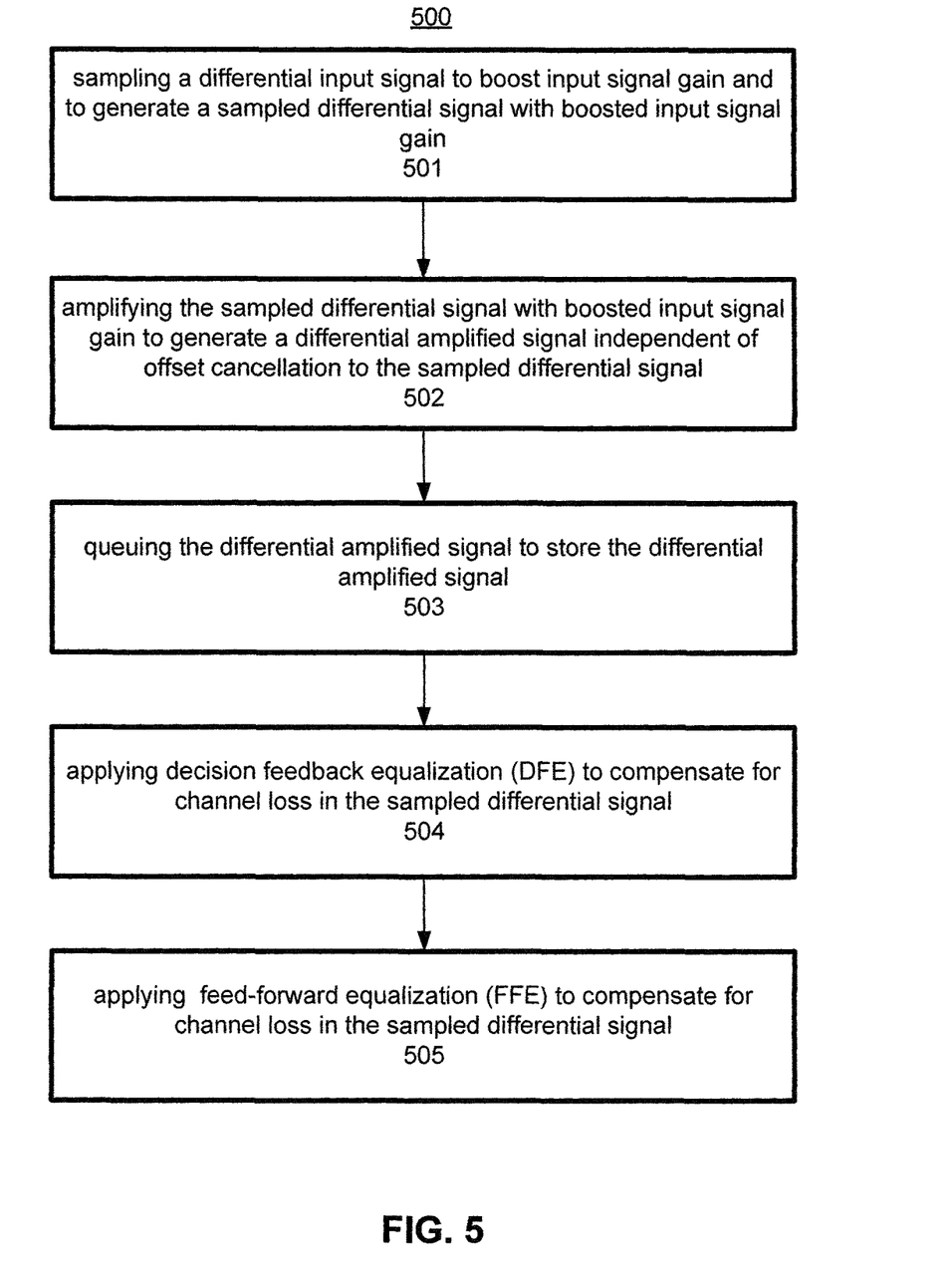
FIG. 5 is a method flowchart for sampling an incoming signal by the low power high-speed digital Rx front-end, according to one embodiment of the invention.

FIG. 5 is a method flowchart 500 for sampling an incoming signal by the low power high-speed digital Rx front-end, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments for sampling an incoming signal by the low power high-speed digital Rx front-end 200. The flowchart of FIG. 5 is illustrated with reference to the embodiments of FIGS. 1-4.

At block 501, a differential input signal Rx is sampled by the sampling unit 201 to boost input signal gain and to generate a sampled differential signal 206 with boosted input signal gain. At block 502, the differential amplifier 202 amplifies the sampled differential signal 206 ($P_1$, $M_1$) with boosted input signal gain to generate a differential amplified signal 207 ($P_2$, $M_2$) independent of offset cancellation to the sampled differential signal 206 ($P_1$, $M_1$).

At block 503, the differential amplified signal 207 ($P_2$, $M_2$) is queued in the queue 203 to store the differential amplified signal 207 ($P_2$, $M_2$). At block 504, the DFE unit 204 applies decision feedback equalization to compensate for channel loss in the sampled differential signal, wherein applying the DFE comprises applying an Exclusive-OR (XOR) operation to the queued differential amplified signal. At block 505, the FFE unit 205 applies feed-forward equalization to compensate for channel loss in the sampled differential signal 206 ($P_1$, $M_1$), wherein applying the FFE comprises coupling nodes ($P_1$, $M_1$), having the sampled differential signal, with programmable capacitors (C1, C2). The capacitances of C1 and C2 are programmed by another logic unit (not shown) according to one embodiment. In one embodiment, sampling the differential input signal comprises: switching the first switch 221 to sample the first signal Rx+, of the differential input signal Rx, during the phase φ1 of the first clock signal Clk1, the sampled differential signal comprising the first signal $P_1$; and switching the second switch 222 to sample the second signal Rx−, of the differential input signal Rx, during the phase φ1 of the first clock signal Clk1, the sampled differential signal comprising the second signal $M_2$.

Figure 6:
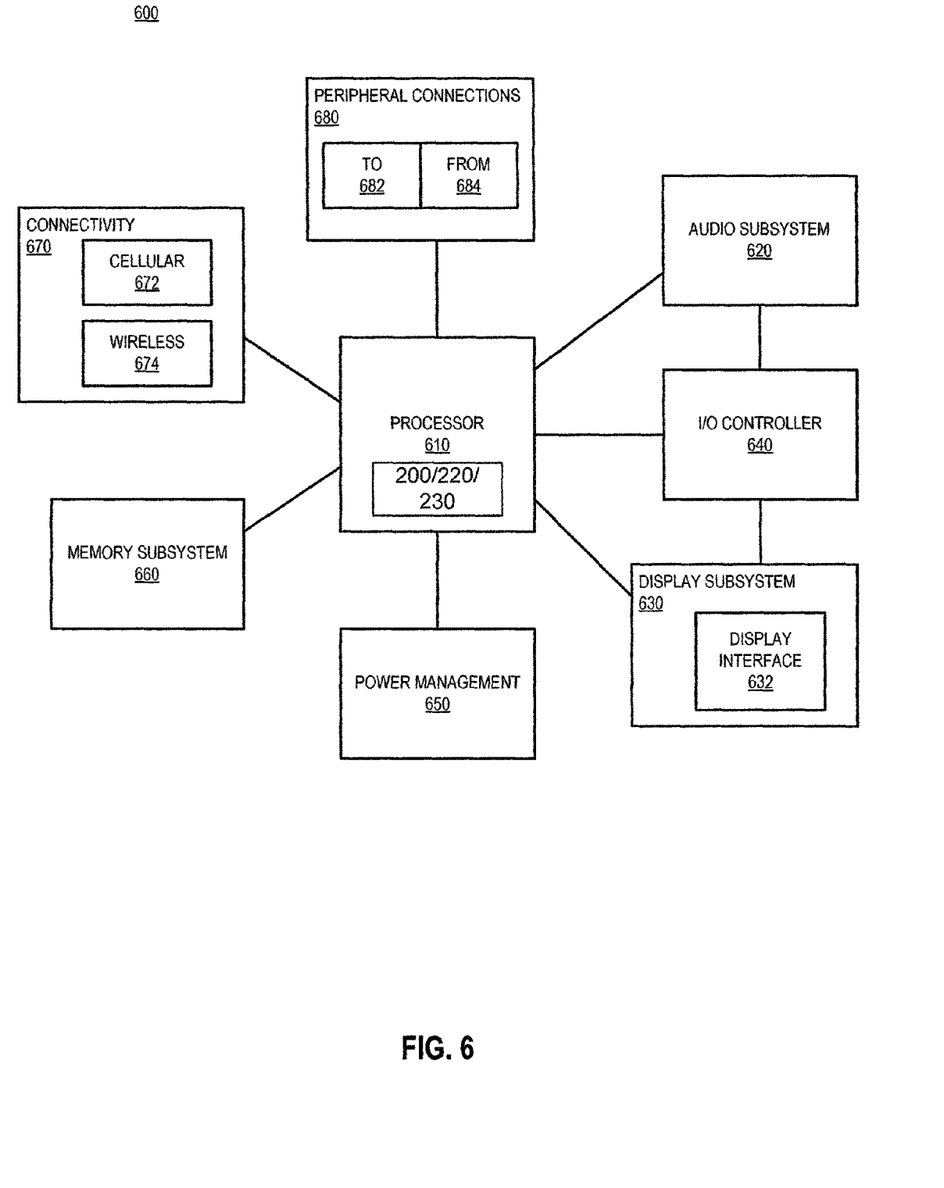
FIG. 6 is a system-level diagram of a smart device comprising a processor including the low power high-speed digital Rx front-end, according to one embodiment of the invention.

FIG. 6 is a system-level diagram of a smart device comprising a processor including the low power high-speed digital Rx front-end, according to one embodiment of the invention. FIG. 6 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes the low power high-speed digital Rx front-end 200 as discussed with reference to FIGS. 1-4.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. For example, while the embodiments are discussed with reference to two phases φ1 and φ2 being of two different clock signals Clk1 and Clk2 respectively, the two phases may be the low and high phases of the same clock signal. The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
 a sampling unit operable to sample a differential input signal and to boost input signal gain, the sampling unit to generate a sampled differential signal with boosted input signal gain, wherein the sampling unit comprises
 a first switch to sample a first signal, of the differential input signal, during a phase of a first clock signal, the sampled differential signal comprising the first signal, a second switch to sample a second signal, of the differential input signal, during the phase of the first clock signal, the sampled differential signal comprising the second signal, a third switch to couple the first signal, of the differential amplified signal, to a node coupled to the second switch, the third switch operable by a phase of the second clock signal; and a differential amplifier to amplify the sampled differential signal with boosted input signal gain, the differential amplifier to generate a differential amplified signal.

2. The apparatus of claim 1 further comprises a queue to store the differential amplified signal.

3. The apparatus of claim 2 further comprises a decision feedback equalizer (DFE) to receive the stored differential amplified signal.

4. The apparatus of claim 3 further comprises a feed-forward equalizer (FFE), coupled to the DFE, to compensate for channel loss in the sampled differential signal with boosted input signal gain.

5. The apparatus of claim 3, wherein the DFE comprises an Exclusive-OR (XOR) logic unit.

6. The apparatus of claim 1, wherein the sampling unit further comprises:

a fourth switch to couple the second signal, of the differential amplified signal, to a node coupled to the first switch, the fourth switch operable by the phase of the second clock signal.

7. The apparatus of claim 1, wherein the sampling unit and the differential amplifier are positioned in a receiver which is one of:

a Mobile Industry Processor Interface (MIPI®) M-PHY$^{SM}$ receiver;

a Peripheral Component Interconnect Express (PCIe) receiver;

a Serial Advanced Technology Attachment (SATA) receiver;

a Serial Attached SCSI (SAS) receiver;

a Double Data Rate x (DDRx) receiver, were 'x' is an integer;

a High-Definition Multimedia Interface (HDMI) receiver; or a Universal Serial Bus x (USBx) receiver, where 'x' is an integer.

8. The apparatus of claim 7, wherein the MIPI® M-PHY$^{SM}$ receiver is operable to receive high-speed (HS) GEAR rate signals.

9. The apparatus of claim 1, wherein the differential amplifier is operable to reject common mode in the sampled differential signal.

10. The apparatus of claim 1, wherein the differential amplifier has a built-in auto-zero function.

11. The apparatus of claim 1, wherein the differential amplifier is operable to amplify independent of offset cancellation in the sampled differential signal.

12. An apparatus comprising:

a sampling unit operable to sample a differential input signal and to boost input signal gain, the sampling unit to generate a sampled differential signal with boosted input signal gain; and a differential amplifier to amplify the sampled differential signal with boosted input signal gain, the differential amplifier to generate a differential amplified signal;

a queue to store the differential amplified signal;

a decision feedback equalizer (DFE) to receive the stored differential amplified signal; and a feed-forward equalizer (FFE), coupled to the DFE, to compensate for channel loss in the sampled differential signal with boosted input signal gain, wherein the FFE comprises programmable capacitors coupling the DFE to a node having the sampled differential signal.

13. A method comprising:

sampling a differential input signal to boost input signal gain and to generate a sampled differential signal with boosted input signal gain, including switching a first switch to sample a first signal, of the differential input signal, during a phase of a first clock signal, the sampled differential signal comprising the first signal, switching a second switch to sample a second signal, of the differential input signal, during a phase of a first clock signal, the sampled differential signal comprising the second signal, and switching a third switch to sample the first signal, of the differential input signal, during a phase of a second clock signal, the sampled differential signal comprising the first signal; and amplifying the sampled differential signal with boosted input signal gain to generate a differential amplified signal independent of offset cancellation to the sampled differential signal;

queuing the differential amplified signal to store the differential amplified signal; and applying decision feedback equalization (DFE) and feed-forward equalization (FFE) to compensate for channel loss in the sampled differential signal.

14. A system comprising:

a wireless connectivity; and a processor, communicatively coupled to the wireless connectivity, the processor having an input-output (I/O) receiver including:

a sampling unit operable to sample a differential input signal and to boost input signal gain, the sampling unit to generate a sampled differential signal with boosted input signal gain, wherein the sampling unit comprises a first switch to sample a first signal, of the differential input signal, during a phase of a first clock signal, the sampled differential signal comprising the first signal, a second switch to sample a second signal, of the differential input signal, during the phase of the first clock signal, the sampled differential signal comprising the second signal, and a third switch to couple the first signal, of the differential amplified signal, to a node having the second signal of the differential input signal, the third switch to couple during a phase of a second clock signal; and a display unit for displaying content processed by the processor.

15. The system of claim 14, wherein the processor comprises:

a differential amplifier to amplify the sampled differential signal with boosted input signal gain, the differential amplifier to generate a differential amplified signal; and a queue to store the differential amplified signal.

16. The system of claim 15, wherein the processor further comprises:

a decision feedback equalizer (DFE) to receive the stored differential amplified signal; and a feed-forward equalizer (FFE), coupled to the DFE, to compensate for channel loss in the sampled differential signal with boosted input signal gain.

17. The system of claim 15, wherein the differential amplifier is operable to perform at least one of:
reject common mode in the sampled differential signal,
perform a built-in auto-zero function, or
amplify independent of offset cancellation in the sampled differential signal.

18. The system of claim 15, wherein the display unit is a touch screen.

19. The system of claim 14, wherein the sampling unit further comprises:
a fourth switch to couple the second signal, of the differential amplified signal, to a node having the first signal of the differential input signal, the fourth switch to couple during the phase of the second clock signal.

20. A system comprising:
a wireless connectivity;
a processor, communicatively coupled to the wireless connectivity, the processor having an input-output (I/O) receiver including
a sampling unit operable to sample a differential input signal and to boost input signal gain, the sampling unit to generate a sampled differential signal with boosted input signal gain, wherein the processor comprises
a differential amplifier to amplify the sampled differential signal with boosted input signal gain, the differential amplifier to generate a differential amplified signal,
a queue to store the differential amplified signal,
a decision feedback equalizer (DFE) to receive the stored differential amplified signal, and
a feed-forward equalizer (FFE), coupled to the DFE, to compensate for channel loss in the sampled differential signal with boosted input signal gain, wherein the FFE comprises programmable capacitors coupling the DFE to a node having the sampled differential signal; and
a display unit for displaying content processed by the processor.

* * * * *